United States Patent [19]

Sakashita et al.

[11] Patent Number: 5,319,224
[45] Date of Patent: Jun. 7, 1994

[54] INTEGRATED CIRCUIT DEVICE HAVING A GEOMETRY TO ENHANCE FABRICATION AND TESTING AND MANUFACTURING METHOD THEREOF

[75] Inventors: Kazuhiro Sakashita; Shuichi Kato; Isao Takimoto, all of Hyogo, Japan

[73] Assignee: Mitsubishi Denki Kabushiki Kaisha, Tokyo, Japan

[21] Appl. No.: 921,614

[22] Filed: Aug. 3, 1992

Related U.S. Application Data

[63] Continuation of Ser. No. 592,492, Oct. 4, 1990, abandoned.

[30] Foreign Application Priority Data

Oct. 11, 1989 [JP] Japan .................. 1-264165

[51] Int. Cl.$^5$ ............................................. H01L 27/02
[52] U.S. Cl. .................... 257/203; 257/786; 257/676; 257/773; 437/180; 437/209
[58] Field of Search .......... 357/40, 45, 65, 41, 357/68; 324/68; 257/786, 203, 786, 203, 676, 211, 773; 437/180, 209

[56] References Cited

U.S. PATENT DOCUMENTS

| | | | |
|---|---|---|---|
| 3,495,133 | 2/1970 | Miller | 317/101 |
| 3,795,845 | 3/1974 | Cass et al. | 317/234 R |
| 4,080,512 | 3/1978 | Ramet et al. | 174/68.5 |
| 4,746,966 | 5/1988 | Fitzgerald et al. | 257/203 |
| 4,831,433 | 5/1989 | Ogura | 357/68 |
| 4,839,820 | 6/1989 | Kinoshita et al. | 357/40 |
| 4,864,381 | 9/1989 | Seefeldt et al. | 257/203 |
| 5,017,993 | 5/1991 | Shibata | 357/40 |
| 5,021,856 | 6/1991 | Wheaton | 357/45 |
| 5,109,265 | 4/1992 | Utesch et al. | 257/786 |

FOREIGN PATENT DOCUMENTS

| | | |
|---|---|---|
| 0136888 | 4/1985 | European Pat. Off. . |
| 3134343A1 | 6/1982 | Fed. Rep. of Germany . |
| 3223276A1 | 1/1983 | Fed. Rep. of Germany . |
| 59-43536 | 3/1984 | Japan . |
| 63-289826 | 5/1987 | Japan . |
| WO85/04518 | 10/1985 | PCT Int'l Appl. . |

OTHER PUBLICATIONS

"Chip I/O Macros Growable and Placeable Within Cell Array", IBM Technical Disclosure Bulletin, vol. 30, No. 10, Mar., 1988, pp. 222-223.

"Large Chip Substrate", IBM Technical Disclosure Bulletin, vol. 28, No. 3, Aug., 1985, p. 965.

Mitsutaka Sato, "Plastic-Molded Semiconductor Device and its Manufacture", Patent Abstracts of Japan, E-832, Oct. 17, 1989, vol. 13, No. 459 (Corresponds to JP 1-179351).

A. H. Mones et al., "Interconnecting and Packaging VLsI Chips", Solid-State Technology, Jan., 1984, pp. 119–122.

*Primary Examiner*—William Mintel
*Assistant Examiner*—Roy Potter
*Attorney, Agent, or Firm*—Lowe, Price, LeBlanc & Becker

[57] ABSTRACT

A method of manufacturing a plurality of integrated circuit devices includes the steps as follows. First, a predetermined plurality number of bonding pads (11, 21) in a predetermined geometry are formed on the surface of each of a plural number of substrate (10, 20). Next, circuits (12, 22) having different signal processing functions respectively are formed in regions of the substrates (10, 20) not occupied by the bonding pads (11, 21), and then, input/output terminals of the circuits (12, 22) are interconnected to respective ones of the bonding pads (11, 21). According to such a manufacturing method of integrated circuit devices, it is possible to employ common devices for wafer test and the same packages for incorporating, and thus reduce production cost and development cost, in case of small quantity production of various types.

15 Claims, 16 Drawing Sheets

INTEGRATED CIRCUIT DEVICE HAVING A GEOMETRY TO ENHANCE FABRICATION AND TESTING AND MANUFACTURING METHOD THEREOF

This application is a continuation of application Ser. No. 07/592,492 filed Oct. 4, 1990 now abandoned.

BACKGROUND OF THE INVENTION

1. Field of the Invention

The present invention relates generally to integrated circuit devices (hereinafter referred to as IC devices) and a manufacturing method thereof and, more particularly, to an IC device which can be developed or manufactured at low cost even in case of producing a small number of multi-kind products, and a method of manufacturing such an IC device.

2. Description of the Background Art

With manufacture techniques advanced in recent years, high integration density, high performance of IC devices have been increasingly developed, and hence such IC devices have been playing a more important role in the electronic industry year by year. Moreover, with electronic devices further diversified, there has been a greater demand for IC devices to be produced in small quantities and various types. Conventionally, to produce small quantity custom IC devices of various types, gate array IC devices have been in wide use that employ both a master slice approach manufacture technique and a design technique utilizing CAD (Computer Aided Design). However, in order to further enhance the performance of electronic circuit devices, there have been increasing demands for the IC devices to have higher performance, i.e., higher operation speed, a higher degree of integration, lower power consumption, etc. even on the basis of small quantity production of various types. Such high-performance IC devices on the basis of small quantity production of various types are manufactured with dedicated masks manufactured to be employed in all the manufacturing steps, and also specially configured tools or the like required in these steps are used depending on the specific IC architecture.

The IC devices generally comprise circuits consisting of internal logic circuits and the like, and bonding pads which are terminals for bonding leads for carrying out transmission of electrical signals between the circuits inside the devices and the external device's circuit. A description will now be given on the structure of the IC devices on the basis of small quantity production of various types, that is, an arrangement configuration of circuits and bonding pads with respect to two IC devices having different signal processing functions and different numbers of input/output terminals.

FIGS. 1A and 1B show a conventional example of chip configurations of two IC devices having different signal processing functions and different numbers of input/output terminals. A substrate 10 of a first IC device shown in FIG. 1A and a substrate 20 of a second IC device shown in FIG. 1B are different from each other in size of their main surfaces and in number of and arranged pattern of their respective bonding pads 11, 21. Circuits 12, 22 mainly formed of internal logic circuits are formed in respective regions enclosed by these bonding pads 11, 21 on the respective substrates 10, 20. Input/output terminals of the circuits 12, 22 are subject to an interconnection processing so as to be conductive with their corresponding bonding pads 11, 21.

FIGS. 2A and 2B show a state of wafer test of the first IC device shown in FIG. 1A, focusing on probing of the chip. This wafer test is the step of testing whether or not the chip is satisfactory by checking the operation of the formed circuit at a previous stage of assembling the chip as a finished product after a wafer step is completed. This test is usually carried out at a stage of developing the IC device and in the step of manufacturing the device, before the step of dicing the wafer. During this wafer test, referring to FIGS. 2A and 2B, the tips of probes 31 for probing, extending from a fixed probe card substrate 30, are in contact with the bonding pads 11 on the substrate 10 mounted on a stage 40. Conductive interconnection patterns 32 are formed on a lower surface of the fixed probe card substrate 30, and electrodes 33 for transmitting electric signals to/from a tester (not shown) are formed on a top surface of the fixed probe card substrate 30. The electrodes 33 and interconnection patterns 32 are electrically connected by a conductive substance covering the inner sidewall of through holes 34. The probes 31 are adhered onto the interconnection patterns 32 by a conductive adhesion substance 35.

During the wafer test, referring to FIGS. 2A and 2B, the wafer having a large number of the first IC devices adjacently formed thereon is mounted on the stage 40 to be temporarily secured thereon. The tip of the corresponding probe 31 of the fixed probe card substrate is forced on each bonding pad 11 in a specific chip area on the wafer so as to be electrically connected with the bonding pad 11. Consequently, electrical signals are transmitted between the circuit 12 in the first IC device and the tester through the bonding pad 11, probe 31, adhesion substance 35, interconnection pattern 32, through hole 34 and electrode 33 of the fixed probe card, to perform an operation test of the first IC device.

FIGS. 3A and 3B show a state that the wafer chip is mounted in a package 50 in order to complete the first IC device as a product. Referring to these figures, the substrate 10 is mounted on a surface of the bottom portion 53 in the package 50, and the bonding pad 11 on the substrate 10 is electrically connected to an external lead (not shown) of the package 50 through a bonding wire 51 and an interconnection pattern 52. After the IC substrate 10 is thus incorporated into the package 50, the surface of the substrate and package is covered with a cap so as to form a final product. While the above wafer test and the chip packaging have been described with respect to the first IC device as an example, these steps are carried out for each type of IC device in small quantity custom production runs. That is, the wafer test and the incorporation of the substrate into the package 50 are also carried out for the second IC device, but the relative arrangement of the bonding pads 21 is different from that of the bonding pads 11. Therefore, the position of the tip of the probing probes 31 in contact with the respective bonding pads 2 is adjusted in registration with the arrangement of the bonding pads 21. Also in a case that the substrate 20 is incorporated in the package 50, since the interconnection patterns 52 and bonding pads 21 are connected by the bonding wire 51, the wire bonding of different pattern from that in the case of the above described first IC device is carried out.

The interconnection between one bonding pad 11 and circuit 12 is shown, for example, in FIGS. 4A-4C. A circuit of this IC device is structured as follows, shown in FIG. 4C showing an equivalent circuit thereof. A common terminal 13 for two MOS transistors in the circuit 12 is electrically connected to a lead 11a of the bonding pad 11 through a contact hole 15. The overall surface of the circuit 12 and the surface of the lead 11a of the bonding pad 11 are both covered with an insulator film 16 for protection.

The interconnection between the bonding pad 11 and circuit 12 is sometimes carried out through an input and/or output buffer circuit 17, as shown in FIG. 5. This input and/or output buffer circuit 17 temporarily stores a signal provided from the bonding pad 11 in accordance with the signal processing speed of the circuit 12 so as to allow the processing speed of a circuit outside the device or the like to match with that of the circuit 12.

All the above described bonding pad 11, circuit 12 and input and/or output buffer circuit 17 can undergo extremely miniaturized processes by using conventional photolithography techniques.

The structure of the integrated circuit device on the conventional basis of small quantity production of various types involves the following problems.

In development of the first IC device and second IC device on the conventional basis of small quantity production of various types, when a fixed probe card for the first IC device is employed for the second IC device upon wafer test, since the number of and arranged pattern of the bonding pads 11 and 21 are not identical between the first and second IC devices, electrical connections between the bonding pads 21 and probes 31 are sometimes not achieved. Therefore, it is difficult to use the same fixed probe card in common between the first and second IC devices. Even if the number of bonding pads 11 is almost the same as that of the bonding pads 21, when a package 50 suitable for one of the IC devices is employed for the other IC device to use the same package 50 in common upon incorporating the IC devices into the package 50, it is possible for any adjacent bonding wires 51 to contact each other and cause electrical shorts. Therefore, it is difficult to employ the same package 50 for both IC devices. Thus, developing or manufacturing two types of IC devices requires a dedicated fixed probe card 30 for a dedicated package 50 to be manufactured depending on the type of the IC devices, entailing the problem of an increase in trial manufacturing cost.

In addition, in the wire bonding step for connecting the bonding wire 51, an adjustment in positional accuracy of wire bonding is not easy due to a limitation in mechanical accuracy. Thus, a variation in arranged pattern of the bonding pads 11, 12 requires a great effort for adjusting the positional accuracy of wire bonding, again entailing an increase in manufacturing cost.

The case of developing or manufacturing two types of IC devices has been described in the foregoing example; however, it is considered that there are a very large number of types of IC devices on the common basis of small quantity production of various types, and hence the foregoing problems are very serious in reality.

The foregoing problems can be eliminated by standardizing the size of substrates and the number of and arranged pattern of bonding pads of the IC devices to those of the largest IC device in order to us the fixed probe card 30 and package 50 in common among the plurality of IC devices. However, it causes increased useless regions on the substrates, namely, increased blank spaces between the circuit regions and the bonding pads, resulting in other problems such as a degradation in performance of the IC devices due to an increased resistance with a longer conductive interconnection pattern as well as a degradation in degree of integration of the IC devices.

The above-described wafer test employing the probe card is disclosed in Japanese Patent Laying-Open No. 63-289826. The disclosed probe card is structured such that a large number of probes are arranged and adhered on a first substrate on which a second substrate having a function of selecting only necessary one(s) of outputs from the respective probes is detachably provided. This structure makes it possible to carry out various different wafer tests by only exchanging the second substrate without restration of the probes in each test. However, even if such a probe card is employed, the aforementioned disadvantages have not been eliminated in wafer test on the basis of small quantity production of various types having different arrangements of bonding pads.

SUMMARY OF THE INVENTION

An object of the present invention is to provide a high integration density custom IC easily produced in a small production run without requiring specialized testing or packaging configurations.

An integrated circuit device of the present invention includes a substrate, a circuit which is formed on the substrate, and carries out input/output of a signal to/from the outside of the device, a plurality of bonding pads for interconnection provided on the substrate, for carrying out input/output of a signal between the circuit and the outside of the device, and interconnection means for electrically connecting the bonding pads with corresponding input/output terminals of the circuit. A predetermined definite number of and a predetermined definite arranged pattern of bonding pads are formed on the substrate. The substrate has arbitrary size which can provide at least a predetermined number of bonding pads thereon. The circuit is provided at an arbitrary position on the substrate other than the position occupied by the bonding pads. The number of bonding pads is equal to or higher than that required for input/output of the signal between the circuit and the outside of the device.

According to the present invention, in case of application for various types of integrated circuit devices, since the number of and the arranged pattern of the bonding pads are definite, a probe card substrate for wafer test or a package in which the substrate is to be incorporated for manufacturing a finished product, and an arranged pattern of the electrodes can be used in common. Consequently, also on the basis of small quantity production of various types, a common probe card substrate or a common package can be used among various types of integrated circuit devices. Moreover, since a common pattern of wire bonding for connecting external terminals and the bonding pads, which is difficult for controlling an accuracy in position due to a limitation in mechanical accuracy of wire bonding machines, can be used, it is unnecessary to repeat the control of position for each integrated circuit device of various types.

A method of manufacturing an integrated circuit device of the present invention includes the steps of: forming the same number of and the same arranged pattern of bonding pads on respective main surfaces of a plurality of substrates; forming circuits each having different signal processing functions in regions on the respective surfaces of the substrates where the plurality of bonding pads are not positioned; and providing interconnection processings between input/output terminals of the respective circuits and the corresponding bonding pads.

According to another aspect of the manufacturing method of the integrated circuit device of the present invention, circuits each having different signal processing functions are first formed on respective surfaces of a plurality of substrates. Next, the surfaces of the respective circuits are covered with an interlayer insulation film on which the same number of and the same arranged pattern of bonding pads are then formed. Thereafter, interconnection processings are provided between input/output terminals of the circuits and the bonding pads.

According to this manufacturing method, it is possible to carry out a wafer test of a plurality of integrated circuit devices of various types on the basis of small quantity production of various types, incorporation of the devices into a package, and wire bonding between external terminals and bonding pads, with the same device and under the same condition.

In addition, the step of first forming the respective circuits on the plurality of substrates and then forming the bonding pads on the interlayer insulation film covering these circuits results in the formation of multilayered integrated circuit devices in which the bonding pads can be formed on regions where the circuits are formed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will now be described with reference to the figures.

Figure 6A:
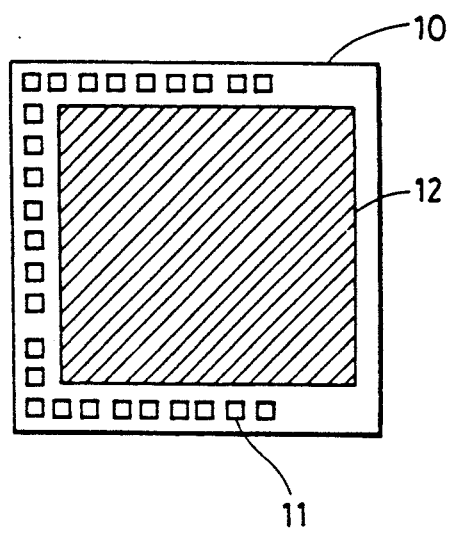
FIGS. 6A and 6B are views showing the arrangement configuration of the bonding pads and circuits on the substrates of first and second integrated circuit devices, respectively, according to a first embodiment of the present invention.
Figure 6B:
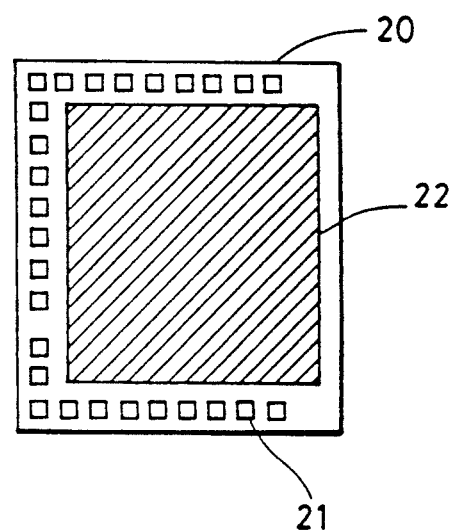

FIGS. 6A and 6B show a chip configuration of a first IC device and that of a second IC device, respectively, according to the first embodiment of the present invention. In the above described conventional example, the number of and arranged pattern of the bonding pads 11 are different from those of the bonding pads 21 between the first and second IC devices; however, in this embodiment, the number of bonding pads 21 in the second IC device is increased to be equal to the number of bonding pads 11, and the bonding pads 11 and 21 are arranged in the same pattern along the three sides of each of the rectangular substrates 10 and 20, respectively. The increased number of bonding pads 21 in the second IC device are unnecessary for the operation of a circuit 22 and are thus not utilized for transmission of signals in practice. In addition, the substrate 10 of the first IC device and the substrate 20 of the second IC device are different in size from each other by laterally shifting one side of each of the substrates 10, 20 on which the bonding pads 11, 21 are provided, relatively with respect to the position of the bonging pads 11, 21. Further, circuits 12, 22 having mutually different breadths are formed in regions inside the bonging pads 11, 21 on the substrates 10, 20, respectively. The circuits 12, 22 are mainly formed of internal logic circuits having signal processing functions, a plurality of input/output terminals (not shown) of which are interconnected with their corresponding bonding pads 11, 21.

Figure 1A:
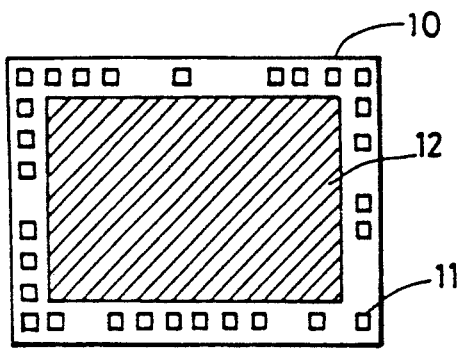
FIGS. 1A and 1B are views showing an arrangement configuration of bonding pads and circuits on substrates of two types of integrated circuit devices on the conventional basis of small quantity production of various types.
Figure 1B:
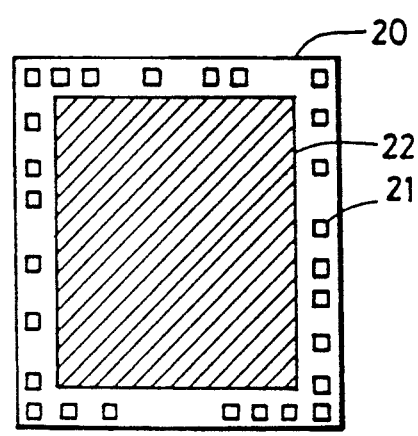
Figure 2A:
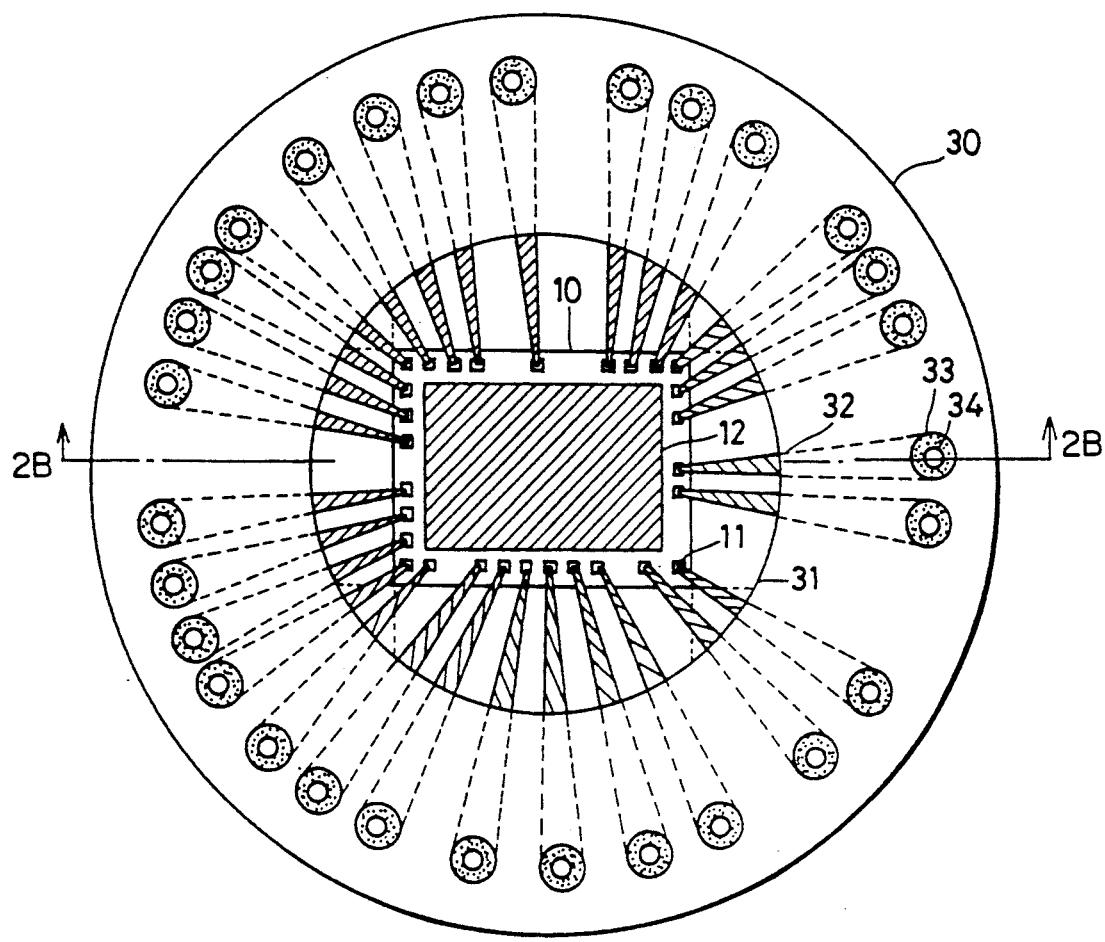
FIG. 2A is a plan view showing the state of a wafer test of an integrated circuit device.
Figure 2B:
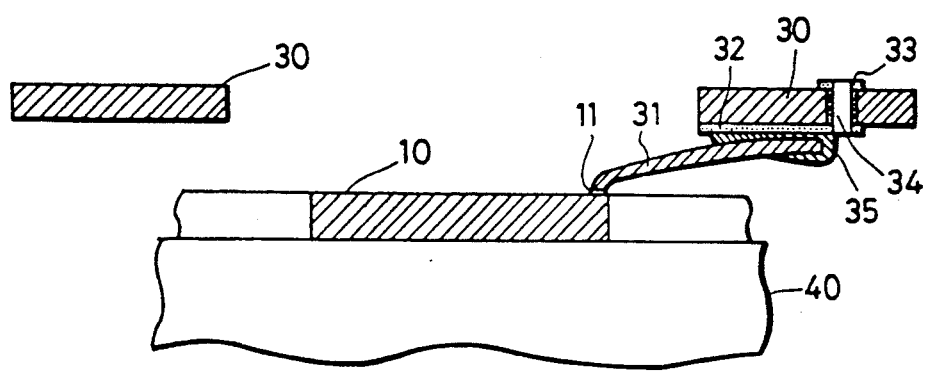
FIG. 2B is a cross-sectional view taken along the line 2B—2B of FIG. 2A.
Figure 3A:
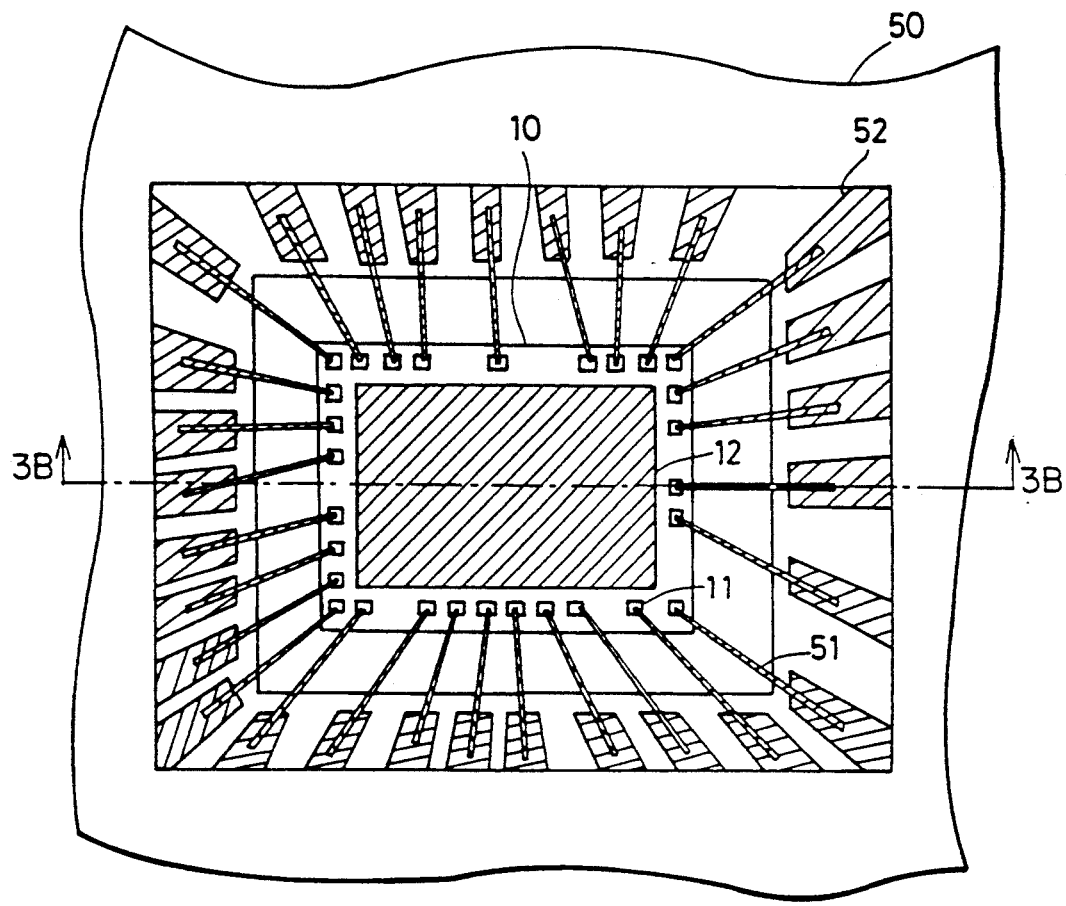
FIG. 3A is a plan view showing a state that an integrated circuit device is mounted in a package 50 and further subjected to wire bonding.
Figure 3B:
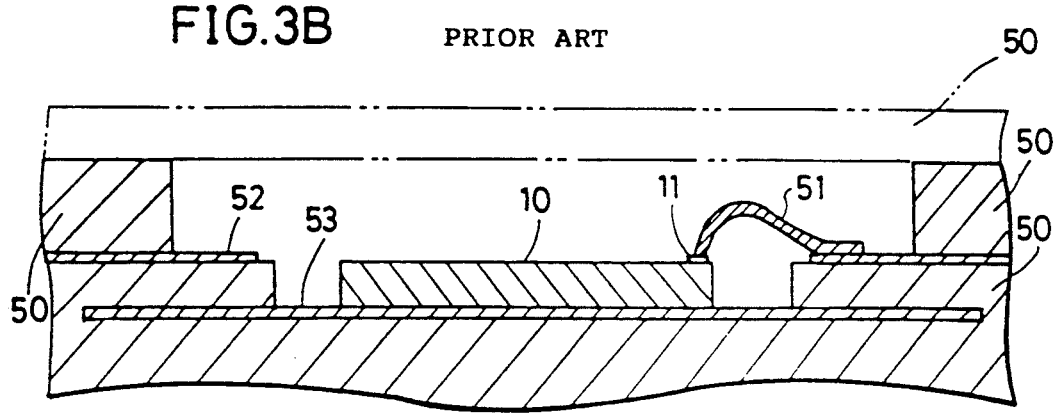
FIG. 3B is a cross-sectional view taken along the line 3B—3B of FIG. 3A.
Figure 4A:
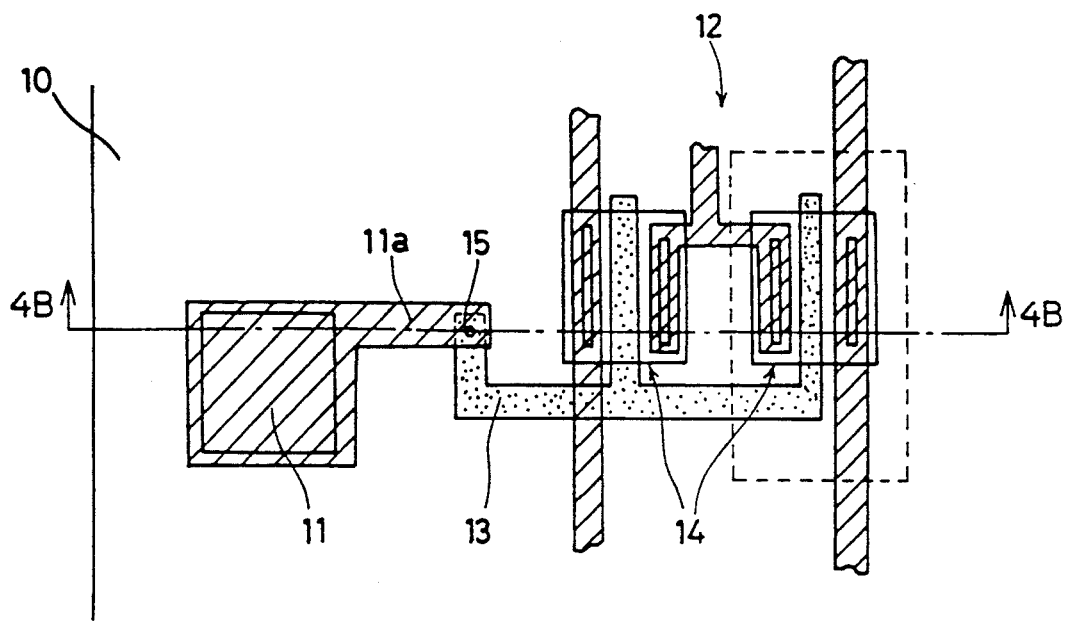
FIG. 4A is a plan view showing one example of a conductive interconnection pattern for connecting an bonding pad 11 and a circuit 12 in an integrated circuit device.
Figure 4B:
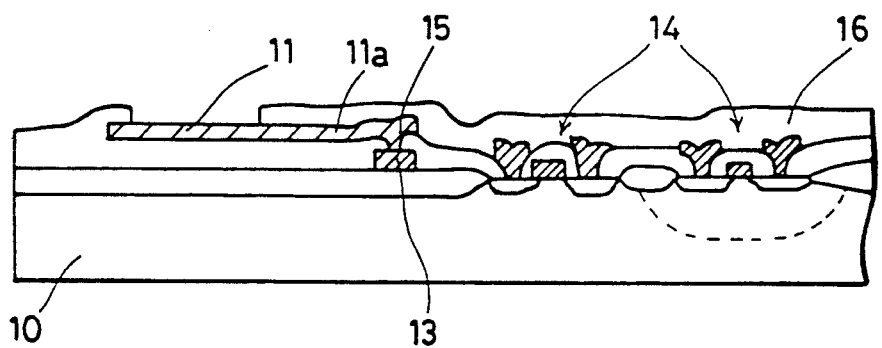
FIG. 4B is a cross-sectional view taken along the line 4B—4B of FIG. 4A.
Figure 4C:
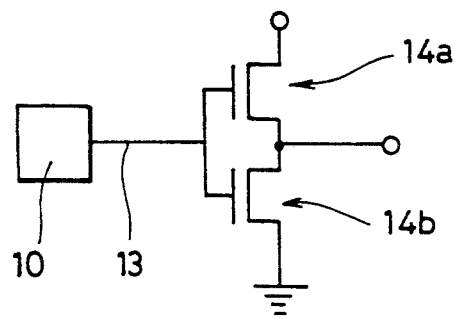
FIG. 4C is an equivalent circuit diagram thereof.
Figure 5:
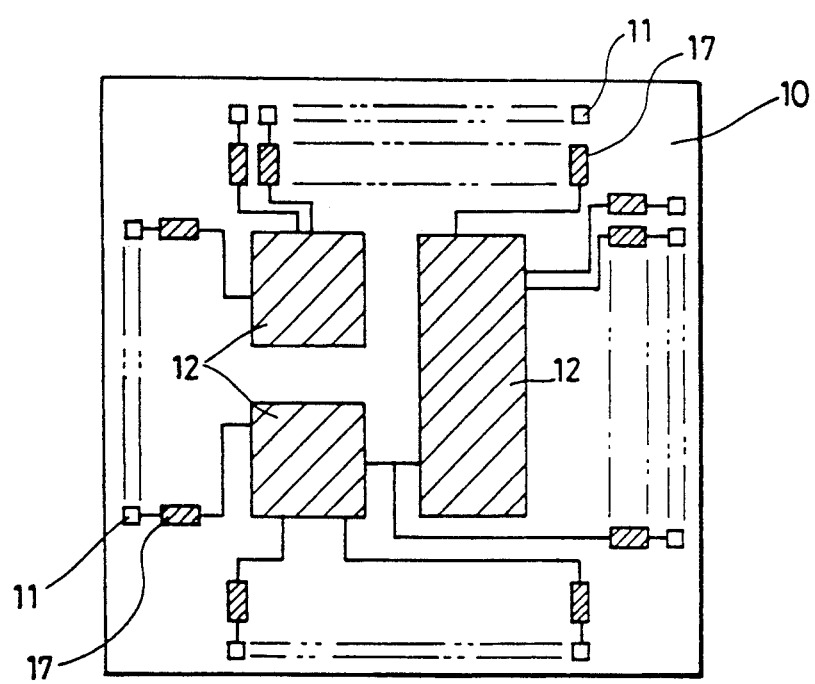
FIG. 5 is a view showing another example of the conductive interconnection pattern for connecting the bonding pad 11 and the circuit 12 in the integrated circuit device.

A wafer test of these IC devices is carried out in the same manner as the conventional shown in FIGS. 2A and 2B. The IC devices are incorporated into the package 50 in the same manner as the conventional shown in FIGS. 3A and 3B. Since the bonding pads 11, 21 have the same arranged pattern between the first and second IC devices upon wafer test, the same probe card substrate can be employed. The same package 50 can also be employed upon incorporation of the devices into the package 50. Unused or dummy bonding pads are contacted by corresponding probes during testing, but are not provided with any signals. Upon final packaging of the IC, unused bonding pads are not connected to terminals of the package.

Therefore, according to this embodiment, the wafer test can be carried out with the same device in developing or manufacturing the circuits 12, 22 having different breadths and signal processing functions. It also becomes possible to mount the devices in the same package 50. This makes it possible to reduce the developing cost and manufacturing cost for such two types of IC devices in which the circuits having different breadths or the like are formed as described above, on the basis of the small quantity production of various types. While the different IC devices of two types are shown in this embodiment, as the types of the IC devices become more diversified, the resultant effects become greater.

Figure 7A:
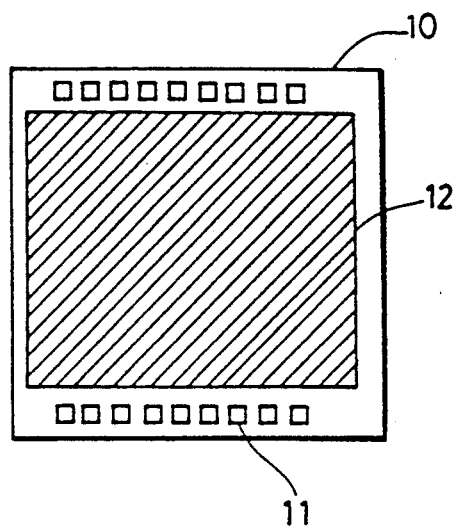
FIGS. 7A and 7B are views showing the arrangement configuration of the bonding pads and circuits on the substrates of the first and second integrated circuit devices, respectively, according to a second embodiment of the present invention.
Figure 7B:
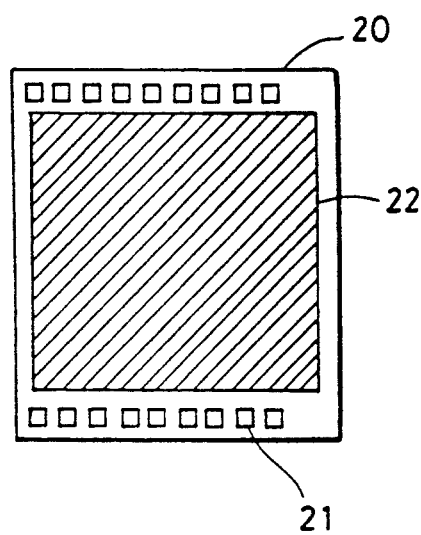

FIGS. 7A and 7B show the chip configuration of the first and second IC devices according to the second embodiment of the present invention. In this embodiment, the number of and arranged pattern of the bonding pads 11 are the same as those of the bonding pads 21, and the bonding pads 11, 21 are arranged in a linear manner, respectively, along two opposing sides of each of the substrates 10, 20. The substrate 10 of the first IC device is different in size from the substrate 20 of the second IC device by varying a distance between the other two opposing sides of each of the substrates 10, 20 where no bonding pads 11, 21 are provided.

Also in this embodiment, it is possible to obtain approximately the same effect as that in the above described first embodiment and also more flexibly determine the relative position of the circuits 12, 22 in a lateral direction with respect to the bonding pads 11, 21.

Figure 8A:
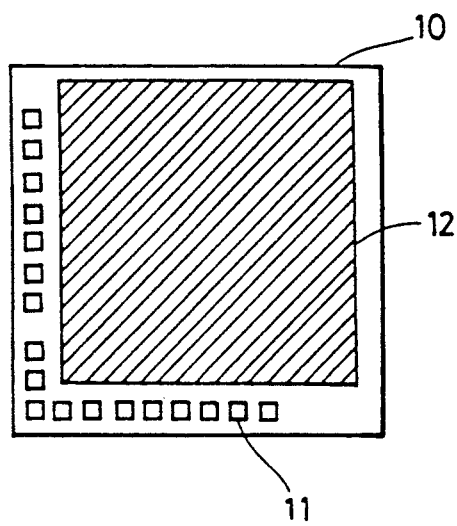
FIGS. 8A and 8B are views showing the arrangement configuration of the bonding pads and circuits on the substrates of the first and second integrated circuit devices, respectively, according to a third embodiment of the present invention.
Figure 8B:
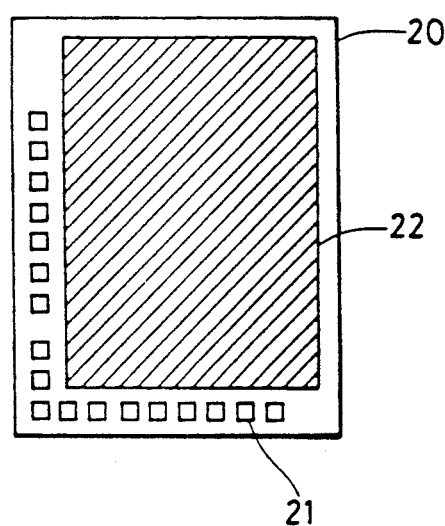

FIGS. 8A and 8B show the chip configuration of the first and second IC devices in the third embodiment of the present invention. In this embodiment, the same number of and the same arranged pattern of the bonding pads 11, 21 are arranged in the form of a character L, respectively, along two adjacent sides of each of the substrates 10, 20. The substrates 10, 20 are different in size by varying laterally or longitudinally the relative position of two sides out of four sides of each of the substrates 10, 20, on which no bonding pads 11, 21 are arranged, with respect to the bonding pads 11, 21.

According to this embodiment, it is possible to obtain approximately the same effect as that in the above described first embodiment, as to the plurality of IC devices in which the circuits with different widths and lengths are formed.

Figure 9A:
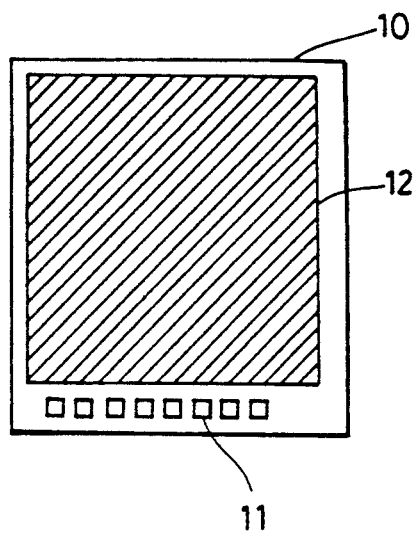
FIGS. 9A and 9B are views showing the arrangement configuration of the bonding pads and circuits on the substrates of the first and second integrated circuit devices, respectively, according to a fourth embodiment of the present invention.
Figure 9B:
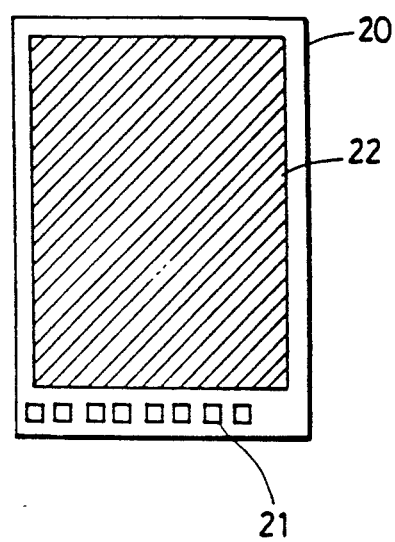

FIGS. 9A and 9B show the chip configuration of the first and second IC devices according to the fourth embodiment of the present invention.

In this embodiment, the same number of and the same arranged pattern of the bonding pads 11, 21 are arranged in a linear manner, respectively, along one side of each of the substrates 10, 20. The substrates 10, 20 are different in size by varying laterally or longitudinally the relative position of the remaining three sides of each of the substrates 10, 20, on which no bonding pads 11, 21 are arranged, with respect to the bonding pads 11, 21.

This embodiment also makes it possible to obtain approximately the same effect as that in the above described third embodiment and more flexibly determine the relative position of the circuits 12,22 in the lateral direction with respect to the bonding pads 11, 12.

Figure 10A:
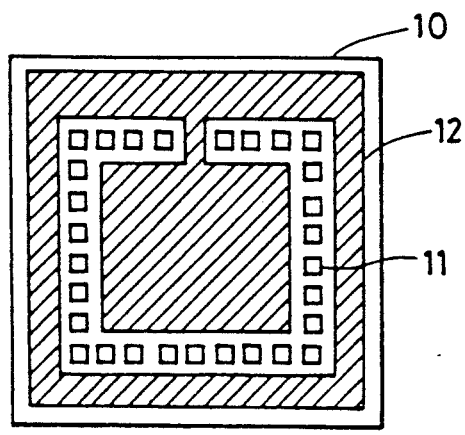
FIGS. 10A and 10B are views showing the arrangement configuration of the bonding pads and circuits on the substrates of the first and second integrated circuit devices, respectively, according to a fifth embodiment of the present invention.
Figure 10B:
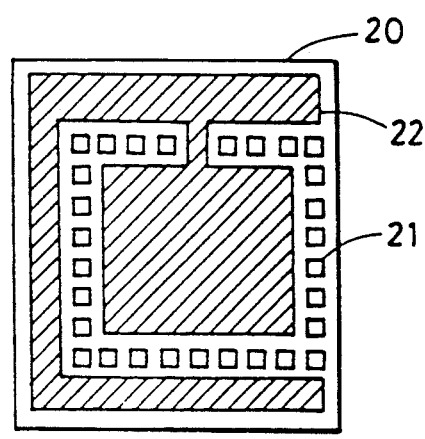

FIGS. 10A and 10B show the chip configuration of the first and second IC devices according to the fifth embodiment of the present invention. In this embodiment, the same number of and the same arranged pattern of the bonding pads 11, 21 are arranged, respectively, along four sides of each of rectangles having the same size and shape on the respective main surfaces of the substrates 10, 20. The substrates 10, 20 are different in size by varying laterally or longitudinally the relative position of the four sides of each of the substrates 10, 20 with respect to the bonding pads 11, 21. The respective circuits 12, 22 are provided in regions between the respective bonding pads 11, 21 and the surroundings of the respective substrates 10, 20 and in regions enclosed by the respective bonding pads 11, 20.

According to this embodiment, it is possible to obtain the same effect as the above embodiment with respect to the plurality of IC devices of various types in which the circuits with different widths and lengths are formed. Further, it is possible to determine more flexibly the relative positional relationship between the bonding pads 11, 21 and the circuits 12, 22. Provision of the bonding pads 11, 21 near the center of the substrates 10, 20 causes comparatively shorter distances between the input/output terminals of the circuits 12, 22 positioned near the center of the substrates 10, 20 and the bonding pads 11, 21, thereby facilitating the interconnection processing, which is another merit of this embodiment.

Figure 11A:
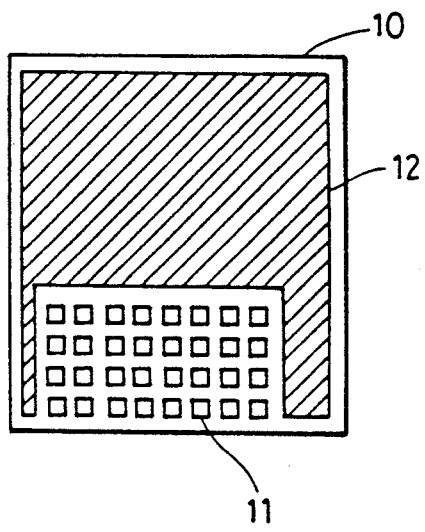
FIGS. 11A and 11B are views showing the arrangement configuration of the bonding pads and circuits on the substrates of the first and second integrated circuit devices, respectively, according to a sixth embodiment of the present invention.
Figure 11B:
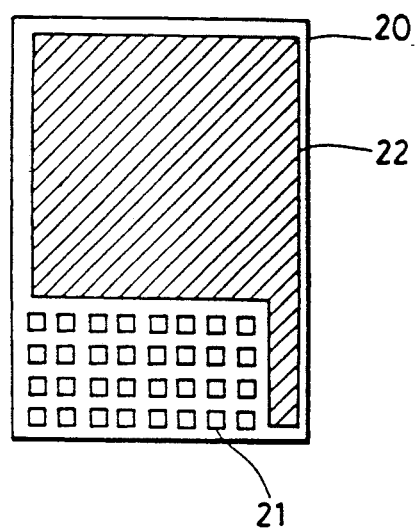

The sixth embodiment of the present invention will now be described with reference to FIGS. 11A and 11B. These figures show the chip configuration of the first and second IC devices of this embodiment. This embodiment is different from the described first through fifth embodiments in that the same number of and the same arranged pattern of the bonding pads 11, 21 are arranged in plural rows and columns roughly in matrix. The number of bonding pads 11, 21 is higher than the number required for transmission of signals between the input/output terminals of the circuits 12, 22 and the outside of the devices. Therefore, the extra bonding pads 11, 21 other than the bonding pads 11, 21 interconnected to the input/output terminals of the circuits 12, 22 are not utilized for the signal transmission. The substrates 10, 20 are different in size by varying laterally and longitudinally the relative positional relationship of each side of each of the substrates 10, 20 with respect to the bonding pads 11, 21.

Figure 12A:
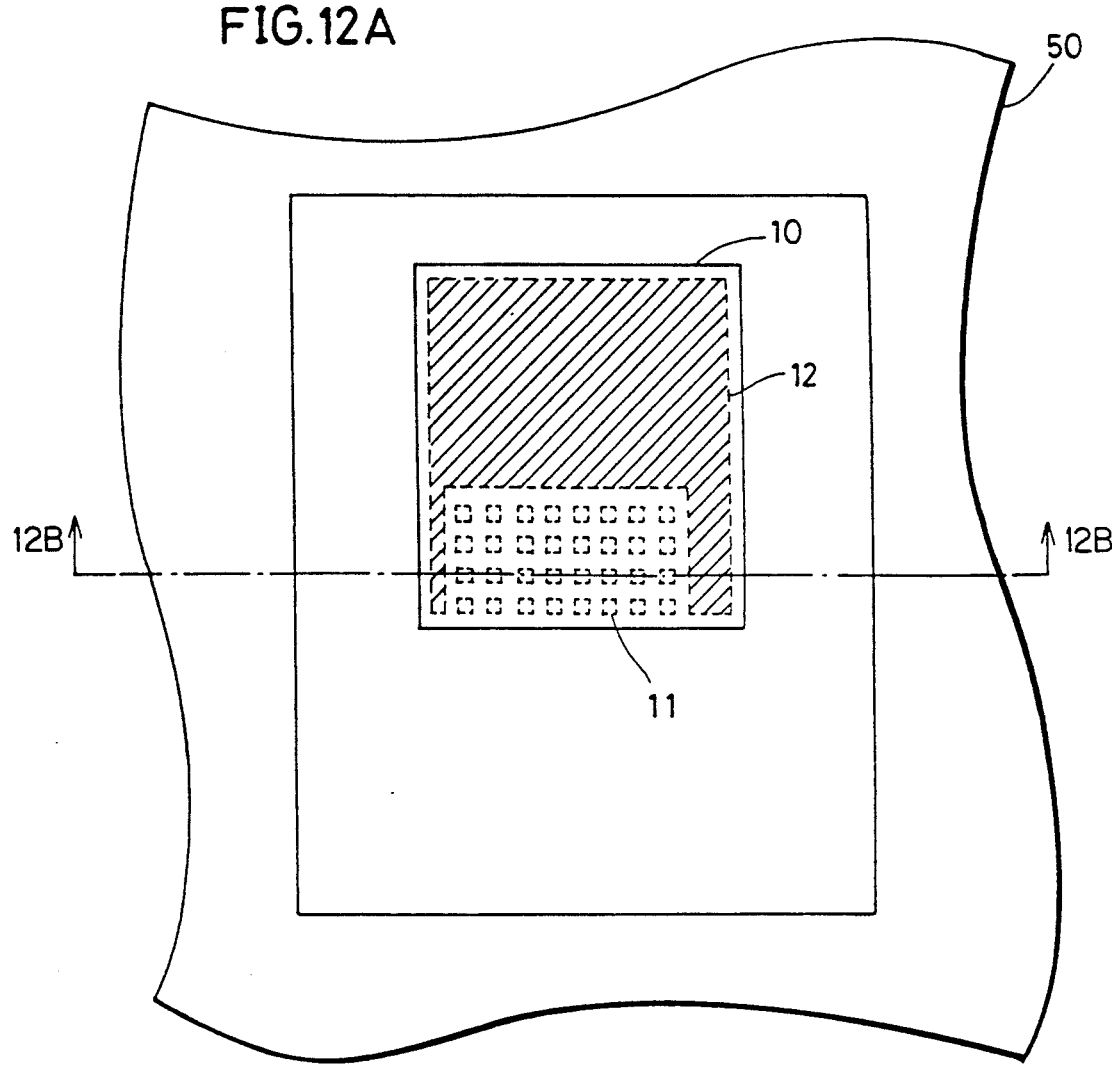
FIG. 12A is a plan view showing a state that the first integrated circuit device according to the sixth embodiment of the present invention is incorporated in the package 50.
Figure 12B:
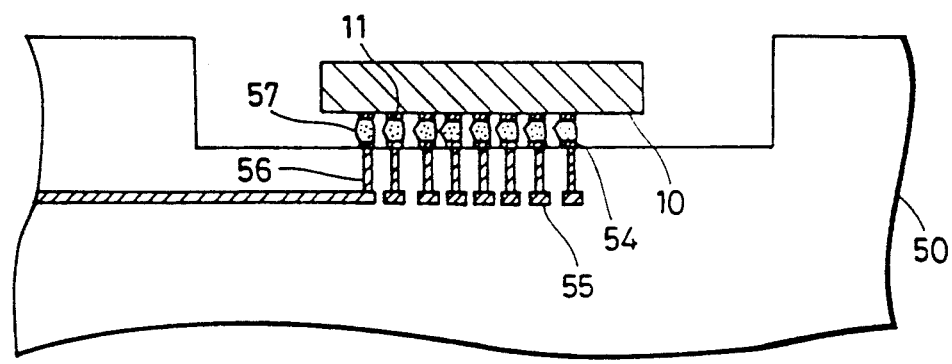
FIG. 12B is a cross-sectional view taken along the line A—A of FIG. 12A.

FIGS. 12A and 12B show a state that the IC device according to this embodiment is mounted in the package 50 formed of an insulation substance. As shown in this figure, the first IC device is mounted in the package 50, with the side of the device, on which the bonding pads 11 are formed, facing downward. Electrodes 54 of the package 50 are formed in positions corresponding to the bonding pads 11. Inside the package 50, a conductive interconnection pattern 55 is provided to be electrically connected with the electrodes 54 by a conductive interconnection substance 56. The electrodes 54 and their corresponding bonding pads 11 are mutually electrically connected and adhered by a conductive adhesion substance 57. The interconnection pattern 55 is electrically connected to an external electrode (not shown) of the package 50.

Thereafter, the first IC device thus incorporated in the package 50 has its surface sealed with resin so as to complete the final product. The bonding pads 11 are electrically connected to the external electrode of the package 50 through the conductive adhesion substance 57, conductive interconnection substance 56 and conductive pattern 55 of the package. This makes it possible to electrically utilize the signal processing function of the circuit 12 from the external electrode of the package 50.

Also in this embodiment, since the bonding pads 11, 21 have the same arranged pattern between the first and second IC devices, it is possible to utilize a common probe card substrate upon wafer test and employ a common package also upon incorporation of the devices into the package 50.

The bonding method in this embodiment is called flip-flop bonding As a basic patent of this flip-flop bonding, U.S. Pat. No. 3,495,133 by Miller et al is provided. The feature of the flip-flop bonding resides in that in bonding, a bonding bump provided such as by soldering (conduction adhesion substance 57 in this embodiment) is heated and welded to be placed on a bonding pad, whereby surface tension of the bonding bump results in automatical registration.

Figure 13A:
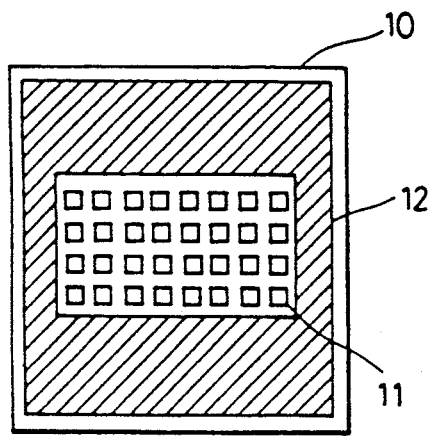
FIGS. 13A and 13B are views showing another manner of the sixth embodiment of the present invention.
Figure 13B:
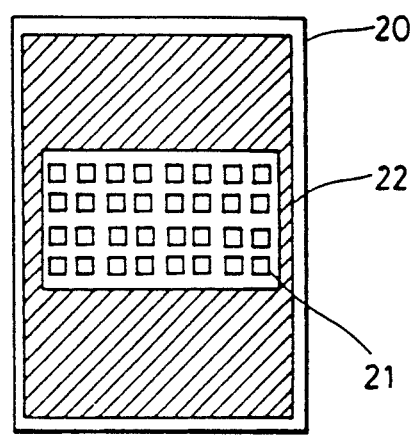

The manner shown in FIGS. 13A and 13B is also available as the positional relationship between the bonding pads 11, 21 and the circuits 12, 22 of this embodiment. In this manner, the same number of and the same arranged pattern of the bonding pads 11, 21 are arranged in matrix in approximately center of the substrates 10, 20, respectively. The substrates 10, 20 are different in size by shifting laterally and longitudinally the relative position of the respective four sides of the substrates 10, 20 with respect to the bonding pads 11, 21.

Figure 14A:
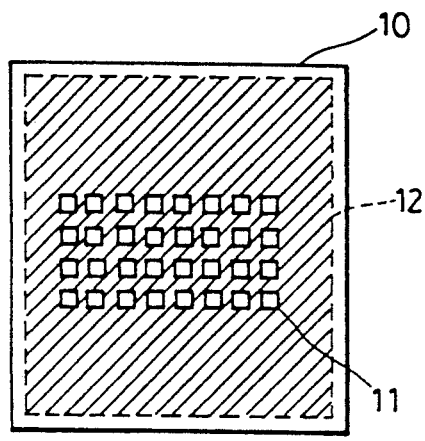
FIGS. 14A and 14B are views showing the arrangement configuration of the bonding pads and circuits on the substrates of the first and second integrated circuit devices, respectively, according to a seventh embodiment of the present invention.
Figure 14B:
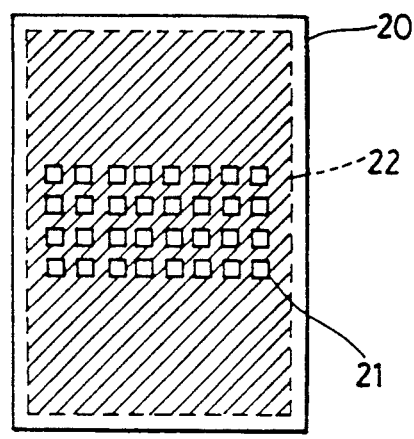

The seventh embodiment of the present invention will now be described. The chip configuration of the first and second IC devices according to this embodiment is, as shown in FIGS. 14A and 14B, the same in planar manner as that shown in FIGS. 13A and 13B according to the sixth embodiment described above. The configuration of this embodiment is different from the above sixth embodiment in that the IC devices of this embodiment have a multilayered structure, in which the bonding pads 11, 21 are formed on the surface of an uppermost layer different from a layer on which the circuits 12, 22 are formed.

Figure 15A:
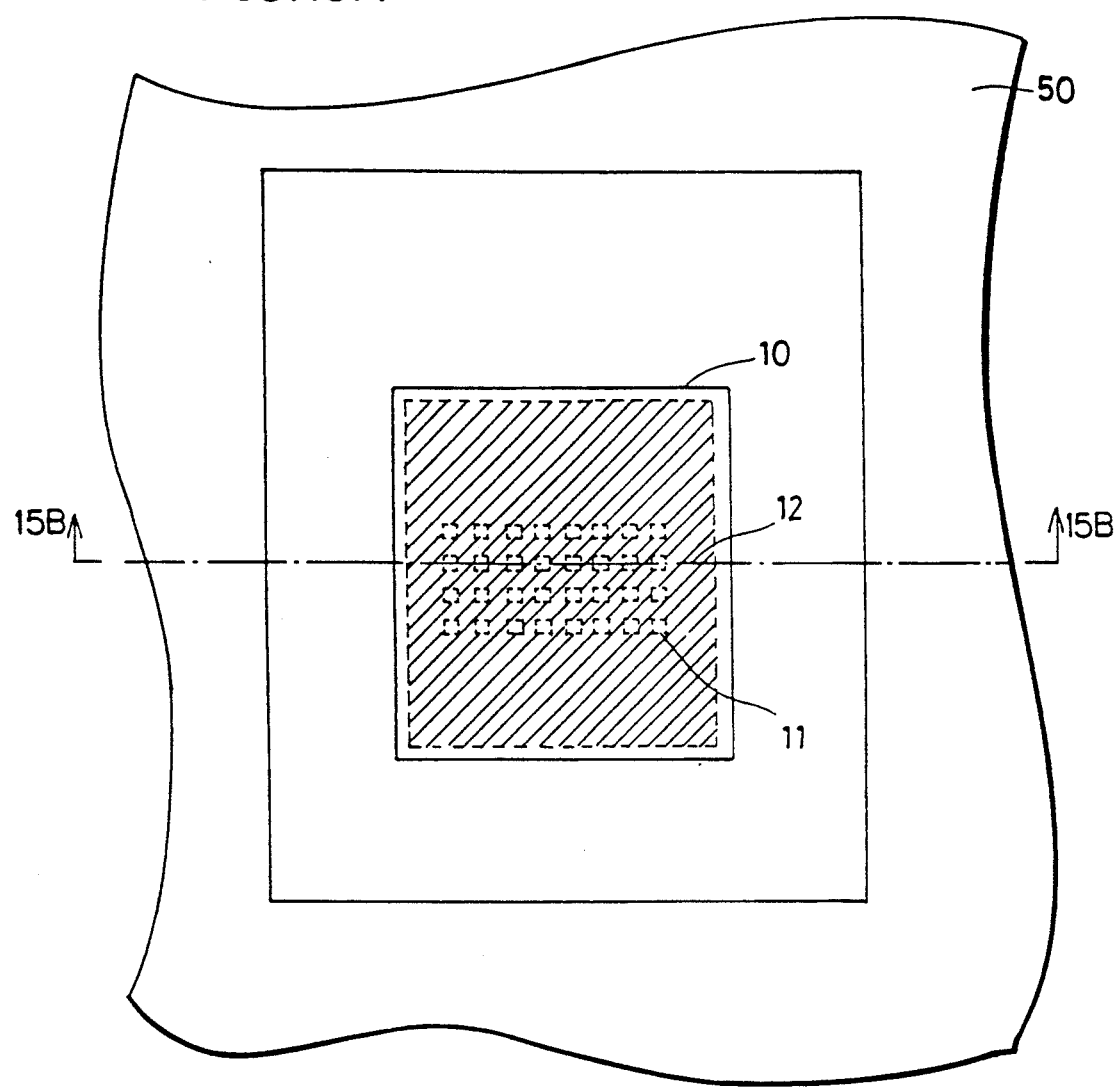
FIG. 15A is a plan view showing a state that the first integrated circuit device according to the seventh embodiment of the present invention is incorporated in the package 50.
Figure 15B:
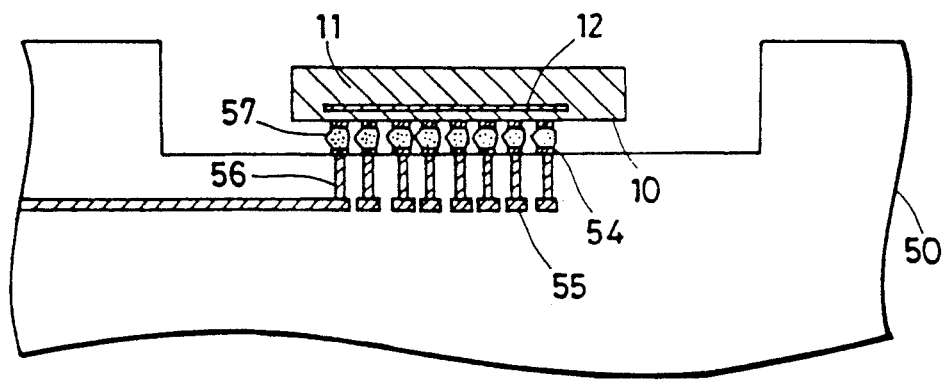
FIG. 15B is a cross-sectional view taken along the line 15B—15B of FIG. 15A.

FIGS. 15A and 15B show a state that the first IC device of this embodiment is mounted in the package 50. Mounting of the substrate 10 on the package 50 and interconnection according to this embodiment are similar to those shown in FIGS. 12A and 12B described in the foregoing sixth embodiment. According to this embodiment, the same effect as that in the above embodiment can be obtained even in the IC device of a multilayered structure. That is, forming the same number of and the same arranged pattern of the bonding pads 11, 21 on the uppermost layer of the substrates 10, 20 makes it possible to use a common probe card substrate for wafer test or a common package for incorporation at the stage of making the final products of plural types of IC devices. Further, since the surface of the substrates 10, 20 on which the bonding pads 11, 21 are formed is different from the layer on which the circuits 12, 22 are formed, in this embodiment, the bonding pads 11, 21 can be arranged in a planar manner also on regions where the circuits 12, 22 are formed.

Figure 16A:
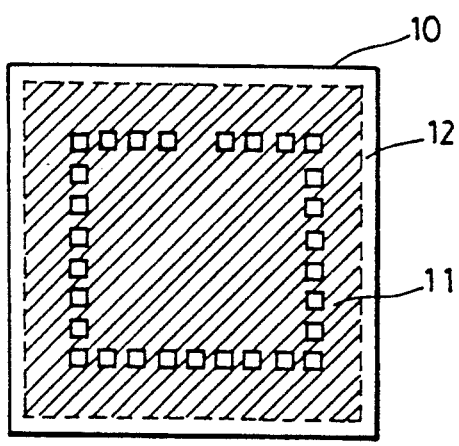
FIGS. 16A and 16B are views showing another manner of the seventh embodiment of the present invention.
Figure 16B:
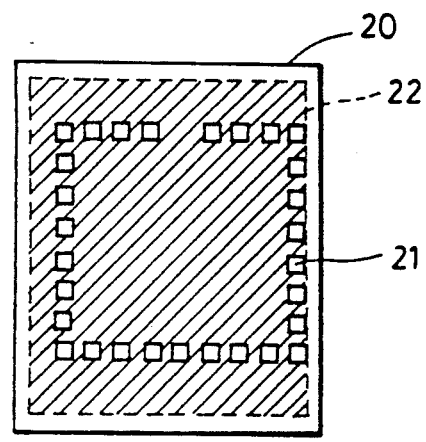

As a manner of this embodiment, an arrangement shown in FIGS. 16A and 16B is also possible which corresponds to the manner shown in FIGS. 10A and 10B according to the foregoing fifth embodiment.

Figure 17A:
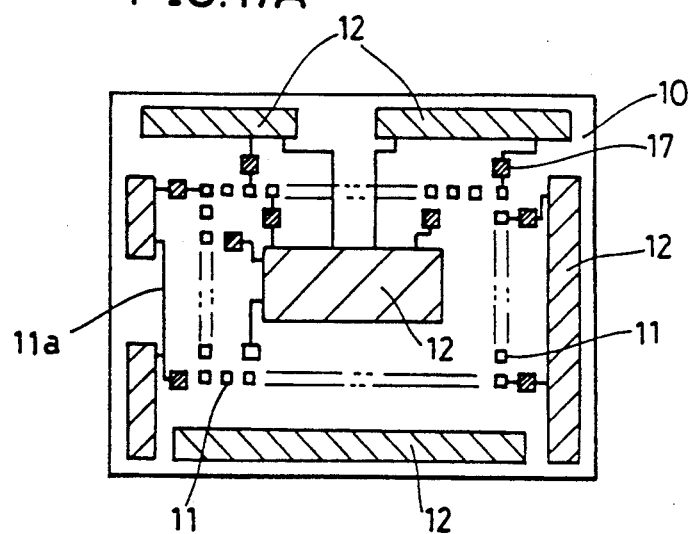
FIGS. 17A and 17B are views showing detailed examples of the arrangement of the bonding pads 11 and circuits 12 of the first integrated circuit device according to the fifth embodiment of the present invention.
Figure 17B:
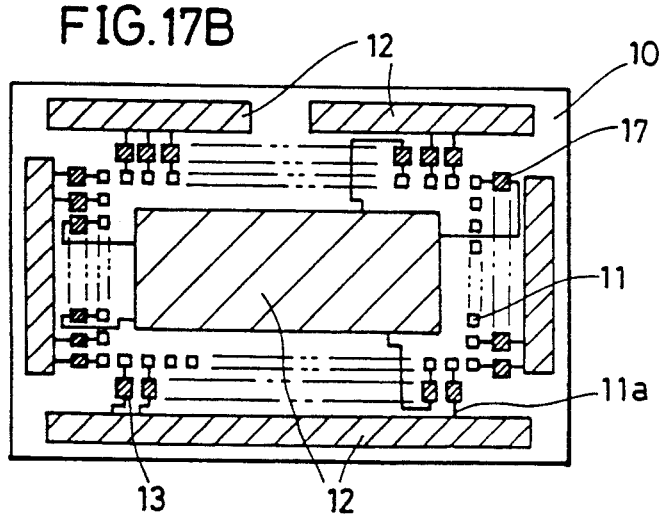
Figure 17C:
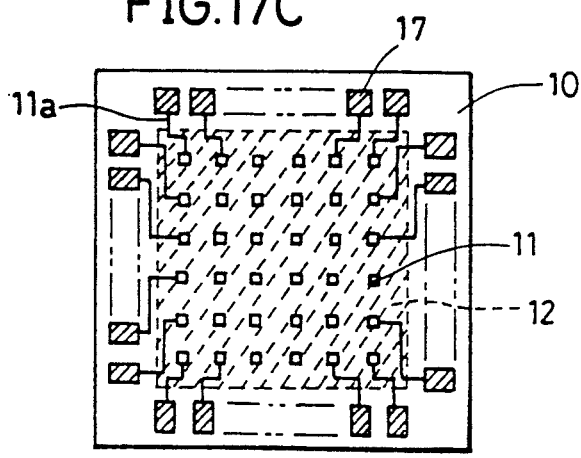
FIG. 17C is a view showing a detailed example of the arrangement of the bonding pads 11 and circuits 12 of the first integrated circuit device according to the seventh embodiment of the present invention.
Figure 18A:
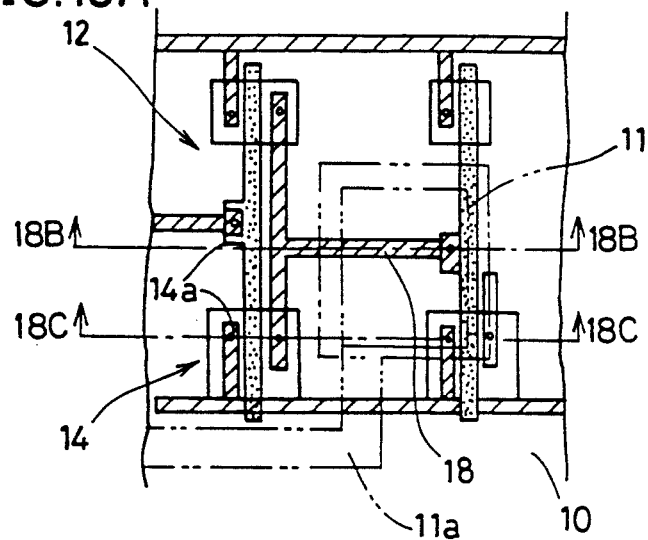
FIG. 18A is a plan view showing a circuit configuration in the vicinity of the bonding pad 11 of the integrated circuit device according to the seventh embodiment of the present invention.
Figure 18B:
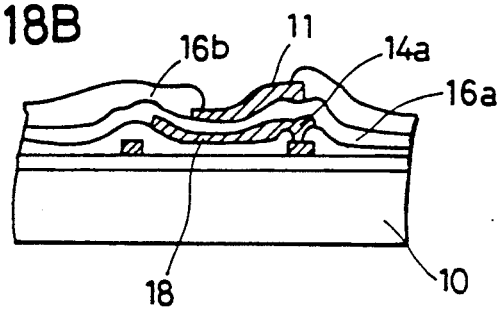
FIG. 18B is a cross-sectional view taken along the line 18B—18B of FIG. 18A.
Figure 18C:
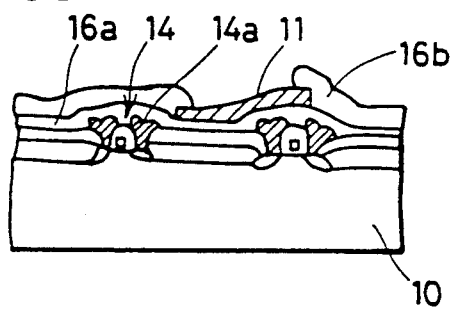
FIG. 18C is a cross-sectional view taken along the line 18C—18C of FIG. 18A.

FIGS. 17A, 17B and 17C show detailed examples of the arrangement of the bonding pads 11 and circuits 12 on the substrate 10 with respect to major ones of the foregoing embodiments. The detailed examples of arrangement shown in FIGS. 17A and 17B show two detailed manners of the fifth embodiment. In these detailed examples of arrangement, an interconnection between each bonding pad 11 and each circuit 12 is carried out by means of an input and/or output buffer circuit 17. The detailed example of arrangement shown in FIG. 17C shows one manner of the foregoing seventh embodiment. In this example, the input and/or output buffer circuits 17 are arranged at peripheries of an uppermost layer of the substrate 10, and the bonding pads 11 are also formed on the same layer. The vicinity of one bonding pad 11 in the detailed example shown in FIG. 17C is, for example, shown in FIGS. 18A, 18B and 18C. Referring to these figures, in the vicinity of the bonding pad 11, the surface of a circuit 12 formed by electrically connecting a MOS transistor 14 and a conductive interconnection layer 18 through a contact hole 14a is covered with an interlayer insulation film 16a. Between the bonding pad 11 formed on the interlayer insulation film 16a and the circuit 12, no contact hole is provided near the bonding pad 11, and hence the bonding pad 11 and circuit 12 are not conductive in this region.

Further, the periphery of the bonding pad 11 and the surface of a lead 11a thereof are covered with an insulation film 16b for protection, and consequently, the rectangular surface of the bonding pad 11 is exposed at the surface of the IC device.

Figure 18D:
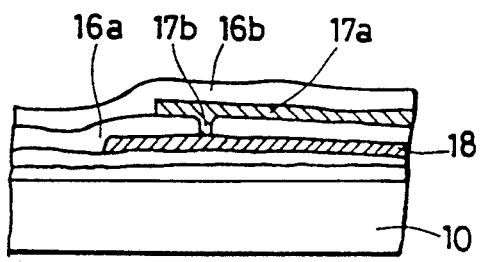
FIG. 18D is a cross-sectional view showing an electrical connection between a lead 17a and an interconnection layer 18 at a portion near the periphery of the substrate 11.

The electrical connection between the bonding pads 11 and the input/output terminals of the circuits 12 is performed in that the lead patterns extending from the bonding pads 11 and the circuits 12 respectively are mutually connected through contact holes formed outside the region of the circuits 12. In the detailed example shown in FIG. 17C, for example, the terminals of the respective input and/or output buffer circuits 17 formed at the periphery of the uppermost layer of the IC device are electrically connected at their leads 17a through the contact holes 17b to the interconnection layers 18 of the circuits 12, 22 positioned immediately beneath the terminals, as shown in FIG. 18D.

As has been described, according to each of the foregoing embodiments, the number of and arranged pattern of the bonding pads 11, 21 are definite in any cases. Thus, it is unnecessary even in the case of small quantity production of various types to alter the design of the package 50 incorporating the IC devices and the probe card substrate for wafer test for each type. What requires the alteration of design is only the interconnection including the input and/or output buffer circuits 17 or the like between the circuits 12, 22 and the bonding pads 11, 21. With the design technique of CAD advanced, this interconnection can be relatively easily altered in design, and the design and manufacture of mask is also easily available. Therefore, the formation of the bonding pads 11, 21, circuits 12, 22 and input and/or output buffer circuits 17, etc. can be relatively easily done by normal photolithography, in all the embodiments.

In addition, the definite number of and definite arranged pattern of the bonding pads 11, 21 causes a blank space region between the bonding pads 11, 21 and circuits 12, 22 to be comparatively large in case of an IC device having the circuits 12, 22 of small size. However, the present invention is often applicable to such IC devices having comparatively close functions and applications in the small quantity production of various types, and hence such a blank space region does not bcome so much large as the above case. When this blank region is large, an interconnection length between the circuits 12, 22 and bonding pads 11, 21 becomes increased, resulting in a problem of an increase in resistance thereof. This blank space region is, however, an interconnection region between the bonding pads 11, 22 and the input and/or output buffer circuit 17, so that when compared with an internal interconnection of the IC device, a capacitive load ten times or more larger than that of the internal interconnection is parasitically connected to this blank space region. Therefore, it is considered that even if this blank space region becomes larger more or less, a degradation of an electrical characteristic thereof is negligible.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An integrated circuit device, comprising:
   a semiconductor substrate;
   a circuit region formed on said substrate and containing a circuit for performing a predetermined function;
   bonding pads on said substrate at a bonding pad region unoccupied by said circuit; and
   interconnections between said bonding pads and corresponding input/output terminals of said circuit;
   wherein said bonding pads comprise a plurality of bonding pads on each of only three sides of said substrate, and
   a portion of said circuit region on said substrate protrudes from a portion of said substrate bounded by said bonding pad region.

2. A plurality of integrated circuit devices each having a separate substrate of a different planar size and each having a circuit formed on the substrate having a plurality of connection nodes, the function of said circuit being different for each integrated circuit device, each of said integrated circuit devices comprising
   a plurality of bonding pads formed on said substrate, the number and layout of said bonding pads being common among said plurality of integrated circuit devices, said bonding pads being electrically connected to corresponding connection nodes of said circuit.

3. A method of manufacturing a plurality of integrated circuit devices each having different outer or edge circuit layout boundaries on respective substrates, comprising the steps of:
   preparing a plural number of separate, dissimilar substrates;
   forming a plurality of bonding pads on each substrate, the number and layout of said bonding pads being common for all said plurality of integrated circuit devices;
   forming circuits in regions of each substrate not occupied by said plurality of bonding pads, the signal processing functions of the circuits are different for each substrate; and
   interconnecting said input/output terminals of said circuits to respective ones of said plurality of bonding pads.

4. The method according to claim 3, further comprising a step of:
   after the step of interconnecting, testing wafers of said plurality of integrated circuit devices by the same probe card having probes the number and layout of which are the same as those of said bonding pads.

5. The method according to claim 3, further comprising a step of:
   after the step of interconnecting, incorporating said plurality of integrated circuit devices in the same type of packages having a common external electrode pattern.

6. The method of manufacturing integrated circuit devices in accordance with claim 3, wherein
   said plurality of substrates (10, 20) have respective rectangular surfaces of different size, and
   said bonding pads (11, 21) are arranged in the same pattern, respectively, near outer circumferences along one to three sides out of four sides of the surface of each of said substrates (10, 20).

7. The method of manufacturing integrated circuit devices in accordance with claim 3, wherein said plurality of substrates (10, 20) have respective rectangular surfaces of different size,
   said bonding pads (11, 21) are arranged on sides of the respective rectangles having sides each substantially parallel to the sides of said substrates (10, 20), and
   said circuits (12, 22) are formed inside and outside the respective regions enclosed by said bonding pads (11, 21)

8. The method of manufacturing integrated circuit devices in accordance with claim 3, further comprising the step of forming an input and/or output buffer circuits (17) in regions between said bonding pads (11, 21) and said circuit (12, 22) before the step of providing the interconnection processing, wherein the input/output terminals of said circuits (12, 22) are interconnected to said bonding pads (11, 21) corresponding to the input/output terminals through said input/output buffer circuit (17).

9. A method of manufacturing a plurality of integrated circuit devices each having different outer or edge circuit layout boundaries on respective substrates, comprising the steps of:

preparing a plurality of separate substrates, each substrate having a different planar size;

forming circuits on each substrate, the signal processing functions of the circuits are different for each substrate;

covering the respective surfaces of said circuits on each substrate with an interlayer insulation film;

forming a plurality of bonding pads on each integrated circuit device on said interlayer insulation film, the number and layout of said bonding pads being common for all said integrated circuit devices; and interconnecting said input/output terminals of said circuits to respective ones of said plurality of bonding pads.

10. The method according to claim 9, further comprising a step of:

after the step of interconnecting, testing wafers of said plurality of integrated circuit devices by the same probe card having probes the number and layout of which are the same as those of said bonding pads.

11. The method according to claim 9, further comprising a step of:

after the step of interconnecting, incorporating said plurality of integrated circuit devices in the same type of packages having a common external electrode pattern.

12. The method of manufacturing integrated circuit devices in accordance with claim 9, wherein said plurality of substrates (10, 20) have respective rectangular surfaces of different size, and in the step of forming said bonding pads (11, 21), said bonding pads (11, 21) are arranged on sides of respective rectangles which are substantially parallel to the respective sides of said substrates (10, 20), on said interlayer insulation film (16a).

13. A plurality of different integrated circuit devices having common numbers and layouts of bonding pads, each integrated circuit device comprising a substrate having a different planar size;

a circuit formed on said substrate for performing a predetermined function which is different for each integrated circuit device, said circuit including input/output terminals for providing electrical signals to and from said circuit;

a plurality of bonding pads formed on said substrate, the number of said plurality of bonding pads being equal to or greater than the number of input/output terminals; and interconnection means for electrically connecting said plurality of bonding pads with a corresponding input/output terminal; wherein the number and layout of said plurality of bonding pads is common among each integrated circuit device of said plurality of different integrated circuit devices.

14. The method of manufacturing integrated circuit devices in accordance with claim 13, wherein said plurality of substrates (10, 20) have respective rectangular surfaces of different size, and in the step of forming said bonding pads (11, 21), said bonding pads (11, 21) are arranged in matrix to form respective rectangles having sides roughly parallel to the respective sides of said substrates (10, 20), on said interlayer insulation film (16a).

15. The method of manufacturing integrated circuit devices in accordance with claim 28, further comprising the step of forming an input and/or output buffer circuit (17) outside regions on said interlayer insulation film (16a) where said bonding pads (11, 21) are formed before the step of providing the interconnection processing, wherein said interconnection processing is carried out through said input and/or output buffer circuit (18).

* * * * *